US009414524B2

(12) United States Patent
Zemke et al.

(10) Patent No.: US 9,414,524 B2
(45) Date of Patent: Aug. 9, 2016

(54) EXTENDED HEAT FRAME FOR PRINTED CIRCUIT BOARD

(71) Applicant: Artesyn Embedded Computing, Inc., Tempe, AZ (US)

(72) Inventors: George Paul Zemke, Chandler, AZ (US); Suzanne Marye Wong, Tempe, AZ (US)

(73) Assignee: Artesyn Embedded Computing, Inc., Tempe, AZ (US)

( * ) Notice: Subject to any disclaimer, the term of this patent is extended or adjusted under 35 U.S.C. 154(b) by 208 days.

(21) Appl. No.: 14/023,521

(22) Filed: Sep. 11, 2013

(65) Prior Publication Data

US 2015/0070848 A1 Mar. 12, 2015

(51) Int. Cl.
*H05K 7/20* (2006.01)
*G06F 1/20* (2006.01)
*H05K 7/14* (2006.01)

(52) U.S. Cl.
CPC .............. *H05K 7/2039* (2013.01); *G06F 1/206* (2013.01); *H05K 7/1404* (2013.01)

(58) Field of Classification Search
None
See application file for complete search history.

(56) References Cited

U.S. PATENT DOCUMENTS

| | | | | |
|---|---|---|---|---|
| 6,026,565 | A * | 2/2000 | Giannatto et al. | 29/830 |
| 6,580,616 | B2 * | 6/2003 | Greenside et al. | 361/752 |
| 6,839,235 | B2 * | 1/2005 | St. Louis et al. | 361/700 |
| 7,796,384 | B2 * | 9/2010 | Irving et al. | 361/694 |
| 8,446,722 | B2 * | 5/2013 | Fowler | 361/690 |
| 8,937,807 | B2 * | 1/2015 | Baquiano et al. | 361/679.54 |
| 2004/0070944 | A1 * | 4/2004 | Wells et al. | 361/704 |
| 2006/0133033 | A1 * | 6/2006 | Straub et al. | 361/690 |
| 2006/0171119 | A1 * | 8/2006 | Baldwin, Jr. | 361/700 |
| 2011/0141692 | A1 * | 6/2011 | Bult | 361/700 |
| 2011/0267776 | A1 * | 11/2011 | Porreca et al. | 361/694 |

* cited by examiner

*Primary Examiner* — Courtney Smith
(74) *Attorney, Agent, or Firm* — Harness, Dickey & Pierce, P.L.C.

(57) ABSTRACT

A circuit board assembly for installation in a cabinet includes a first standards based size first mounting frame portion having a PCB mounted thereto. A second mounting frame portion is connected to the first mounting frame portion having no portion of the PCB connected thereto. A combination size of the first and second mounting frames defines a larger second standards based size. Multiple heat transfer components may be connected to the first or second mounting frame portion provide a conduction/convection cooling path. The first mounting frame portion may include a first false board edge and the second mounting frame portion includes one or more false board edge(s) positioned laterally and oppositely directed to the first false board edge. The first and second false board edges are slidably received in opposed slots created in a cabinet.

16 Claims, 4 Drawing Sheets

100
90
98
92
D
96
94
76

82
88
C
80
78
E
90
84
86

EXTENDED HEAT FRAME FOR PRINTED CIRCUIT BOARD

FIELD

The present disclosure relates to heat frames used in conjunction with printed circuit boards.

BACKGROUND

This section provides background information related to the present disclosure which is not necessarily prior art.

Ruggedized electronic systems commonly include one or more printed circuit boards (PCBs) which have a heat frame made for example of a heat conductive metal such as aluminum which is used to conductively transfer component heat from the PCB outward through the heat frame to a cooling structure of the electronics chassis or to a finned cooling component. PCBs are normally slidably received in the electronics chassis via opposed chassis guide rails, which sequentially located multiple PCBs, as well as provide the location to mechanically couple the PCB to the chassis. PCBs can also include a false board edge, which is a location where the main PCB is locally cut away at a location where the PCB would normally interface with the chassis guide rails, which is filled with mechanical structure in place of the PCB portion.

False board edges are provided to act as a load carrying member at the chassis guide rails. In place of a relatively heavy heatsink/heat frame that bends the PCB in response to vibration, the rigid metal structure of the heatsink/heat frame is instead tied to the chassis, and the PCB is connected to the rigid mechanical structure.

SUMMARY

This section provides a general summary of the disclosure, and is not a comprehensive disclosure of its full scope or all of its features.

According to several aspects, a circuit board assembly includes a first mounting frame portion of a first standards based size having a PCB mounted thereto. A second mounting frame portion is connected to the first mounting frame portion having no portion of the PCB connected thereto. A combination size of the first and second mounting frames defines a larger second size. At least one heat transfer component may be connected to the second mounting frame portion creating a conduction/convection cooling path away from the first mounting frame portion for removing heat generated by the PCB via the second mounting frame portion.

According to other aspects, a circuit board assembly for installation in a cabinet includes a first mounting frame portion of a first standards based size having a PCB mounted thereto. A second mounting frame portion is connected to the first mounting frame portion having no portion of the PCB connected thereto. A combination size of the first and second mounting frames defines a larger second size. Multiple heat transfer components may be connected to the second mounting frame portion providing a conduction/convection cooling path away from the first mounting frame portion for removing heat generated by the PCB via the second mounting frame portion. The first mounting frame portion may include a first false board edge and the second mounting frame portion includes one or more false board edge positioned laterally and oppositely directed with respect to the first false board edge. The first and second false board edges are slidably received in opposed slots created in a cabinet.

According to further aspects, an electronic cabinet system includes a cabinet having multiple first board slots created in a cabinet first wall and multiple second board slots created in a cabinet second wall. A circuit board assembly may include a first mounting frame portion of a first standards based circuit board size having a PCB mounted thereto. A second mounting frame portion is connected to the first mounting frame portion having no portion of the PCB connected thereto. A combination size of the first and second mounting frames defines a larger second circuit board size. At least one heat transfer component may be connected to the second mounting frame portion providing a conduction/convection cooling path away from the first mounting frame portion for removing heat generated by the PCB via the second mounting frame portion. The first mounting frame portion may include a first false board edge slidably received in one of the first board slots and the second mounting frame portion includes one or more false board edge(s) positioned laterally and oppositely directed with respect to the first false board edge.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
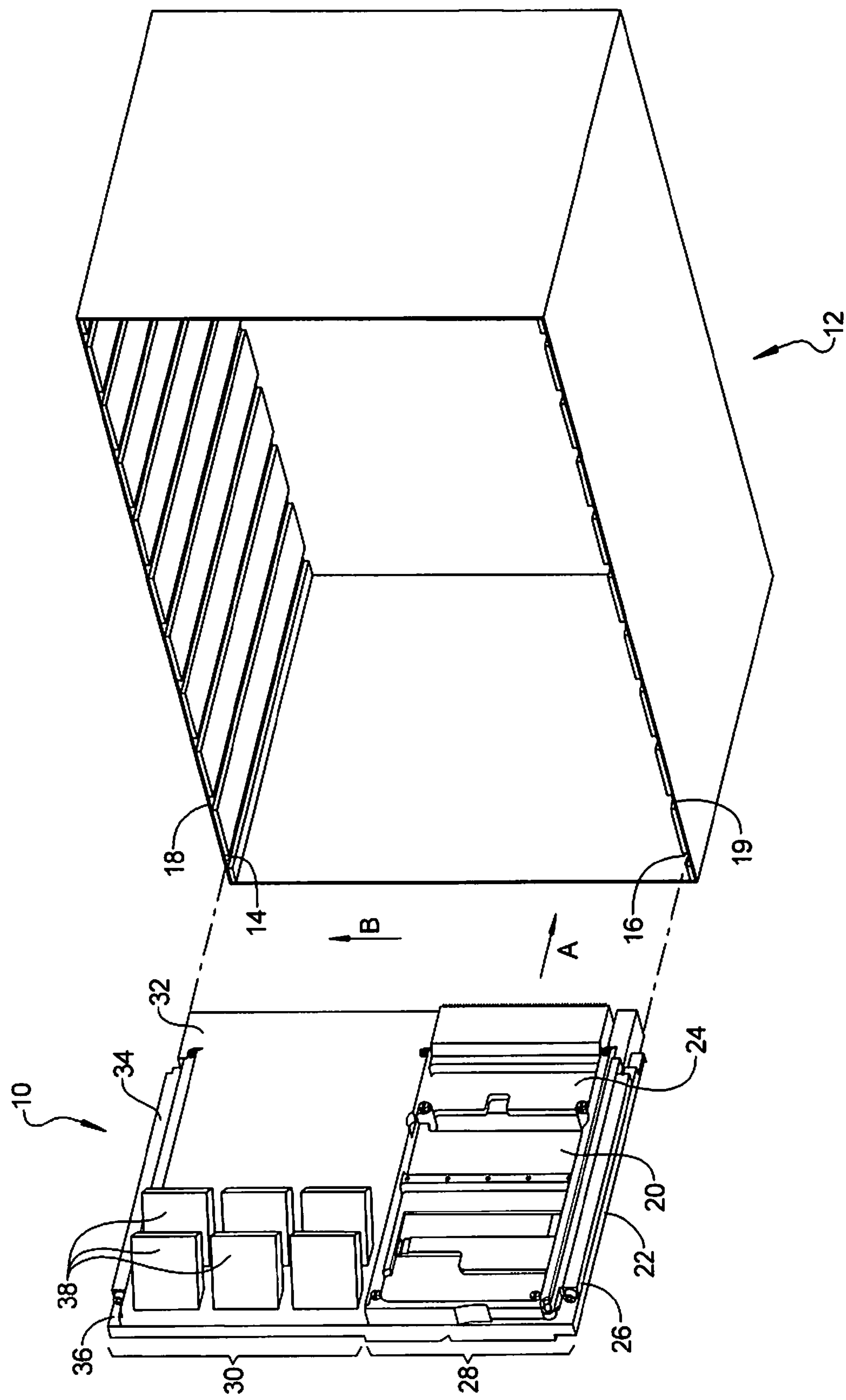
FIG. 1 is a left front perspective view of an exemplary cabinet for housing a circuit board assembly of the present enclosure.

Referring to FIG. 1, a circuit board assembly 10 can be adapted for sliding insertion into a chassis or housing such as a cabinet 12. Circuit board assembly 10 is slidably received in an installation direction "A" within first and second board slots 14, 16 created in each of a cabinet first wall 18 and a cabinet second wall 19. Cabinet 12 can include a single set of first and second board slots 14, 16 to receive a single circuit board assembly 10 or multiple sets of first and second board slots 14, 16 to receive multiple circuit board assemblies 10. Cabinet 12 can be used as a housing for a communication device such as a radio set or a computer station that can be exposed to atmospheric temperature conditions. Cabinet 12 and the components therein can therefore be exposed to ambient temperatures that may impose additional constraints on the ability to cool the components of circuit board assembly 10.

According to several aspects, circuit board assembly 10 includes a standard sized printed circuit board (PCB) 20 such as a 3U board which is mounted to a first mounting frame portion 22. A heat frame 24 is provided in contact with PCB 20. Heat generated by the electrical components of PCB 20 can be conductively transferred away from PCB 20 via the heat frame 24 through a false board edge 26 to the cabinet second wall 19 via direct contact. The components of circuit board assembly 10 represented by a standard size (for example a 3U or a 6U standards based OVPX board) define a first portion 28 of circuit board assembly 10. In certain operating conditions such as the high ambient temperature conditions in a desert environment, the heat generated by PCB 20 exceeds the conductive capability of the heat frame 24 to remove. To increase the heat removal capability without changing PCB 20, a second portion 30 is added to circuit board assembly 10.

Second portion 30 includes a second mounting frame portion 32 extending from the first mounting frame portion 22. Second mounting frame portion 32 does not include any portion of PCB 20. Second mounting frame portion 32 includes an extension portion false board edge 34 which is provided at a perimeter edge 36 of second mounting frame portion 32 oppositely directed with respect to false board edge 26. Extension portion false board edge 34 is slidably and frictionally received in first board slot 14 of cabinet first wall 18. Because second mounting frame portion 32 is positioned above PCB 20 when mounted in cabinet 12, the surface area of second mounting frame portion 32 provides a conductive heat transfer path "B" to cabinet first wall 18. To further increase the heat transfer capability of circuit board assembly 10, at least one and according to several aspects multiple heat transfer components 38 may be mounted to second mounting frame portion 32. Heat transfer components 38 can be provided in one example in the form of heat transfer fins, however any device providing increased surface area for convective heat transfer can be used, including tabs, wafers, plates and the like. The heat transfer components 38 and second mounting frame portion 32 increase a convective heat transfer area of circuit board assembly 10 without making any changes to the standard size PCB 20 or to heat frame 24.

The total area of circuit board assembly 10 provided by both first and second areas 28, 30 directly corresponds to an area of a larger footprint board. For example, if PCB 20 and first mounting frame portion 22 have a 3U standards based OVPX footprint, the total footprint of circuit board assembly 10 can be configured to correspond to a 6U standards based OVPX design. This permits interchangeability of circuit board assembly 10 for boards in a cabinet designed for larger (i.e., 6U OVPX) boards, thereby maintaining spacing, wedge-lock usage and board installation/removal parameters.

Referring to FIG. 2 and again FIG. 1, circuit board assembly 10 includes PCB 20 connected to the first mounting frame portion 22. One or more computer components 40 are connected to printed circuit board 20, which can include items such as a central processing unit (CPU) 42, a DIP switch 44, multiple memory devices 46, and other components such as a MOSFET, a power circuit, and/or a field programmable gate array (FPGA). During operation, the heat generated by CPU 42 can also in part be conductively dissipated for example by heat transfer to the cold edge at 22 and 34. The conductive thermal transfer device such as heat frame 24 is directly connected to first mounting frame portion 22. Heat frame 24 is in proximity to PCB 20 and provides additional conductive heat transfer paths for all of the heat generating components of circuit board assembly 10, including CPU 42. Second mounting frame portion 32 can be an integral portion extending from first mounting frame portion 22, or can be separately connected to first mounting frame portion 22.

Figure 2:
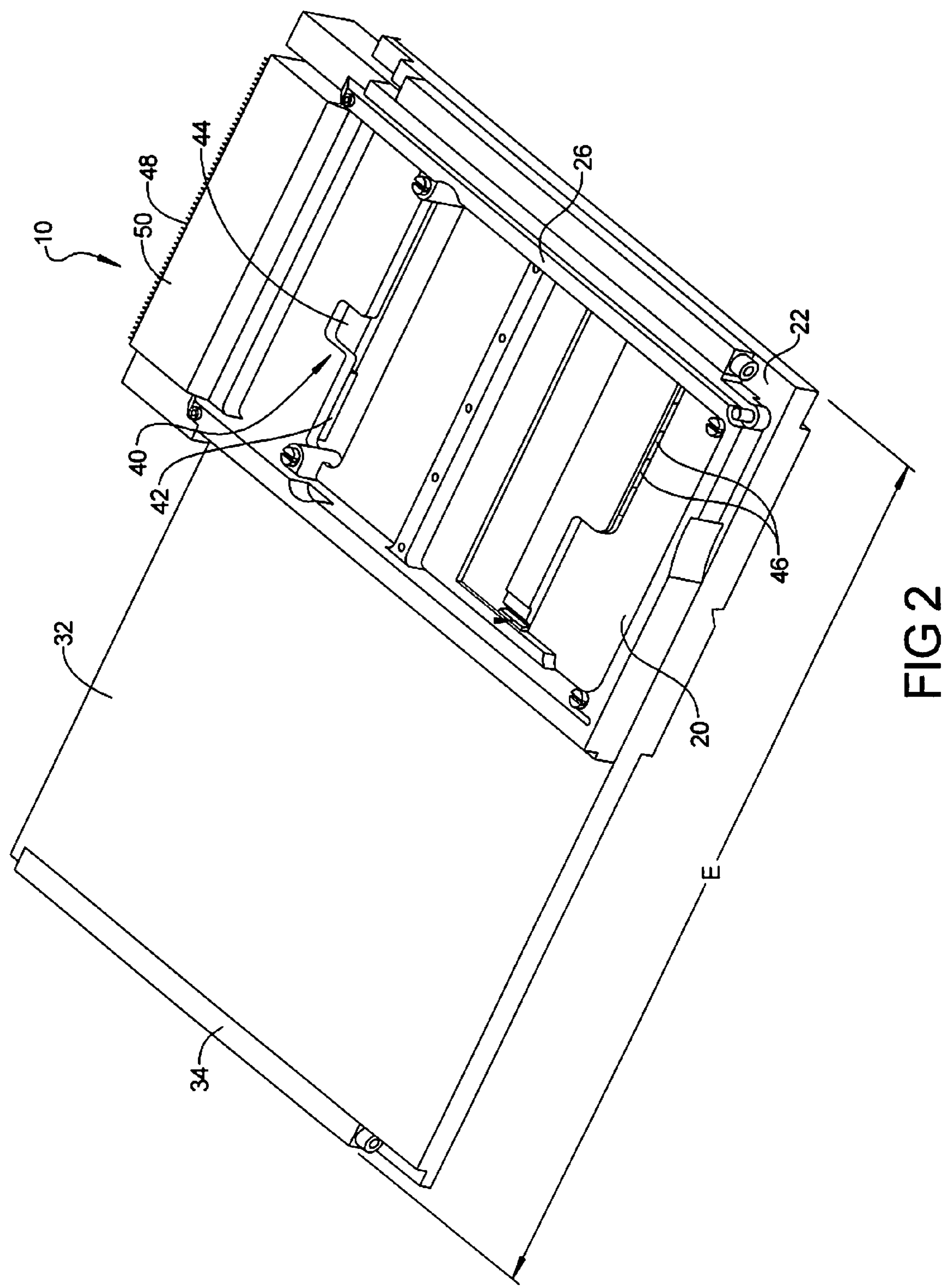
FIG. 2 is a top left perspective view of a circuit board assembly of the present enclosure.

Referring to FIG. 3 and again to FIGS. 1 and 2, a circuit board assembly 52 is similar to circuit board assembly 10 having a PCB 54 mounted to a first mounting frame portion 56, and further includes additional structural features including first and second support wings 58, 59 connected to a second mounting frame portion 60. An assembly 62 of heat transfer components 64 includes multiple rows of heat transfer components 64 configured in at least first, second, third, fourth and fifth rows 66, 68, 70, 72, 74 extending in a lateral direction "C" with respect to PCB 54. The quantity of rows of heat transfer components 64 can also vary depending on the size and spacing of heat transfer components, therefore the quantity of rows or direction of the rows can vary between different circuit board assemblies of the present disclosure.

Figure 3:
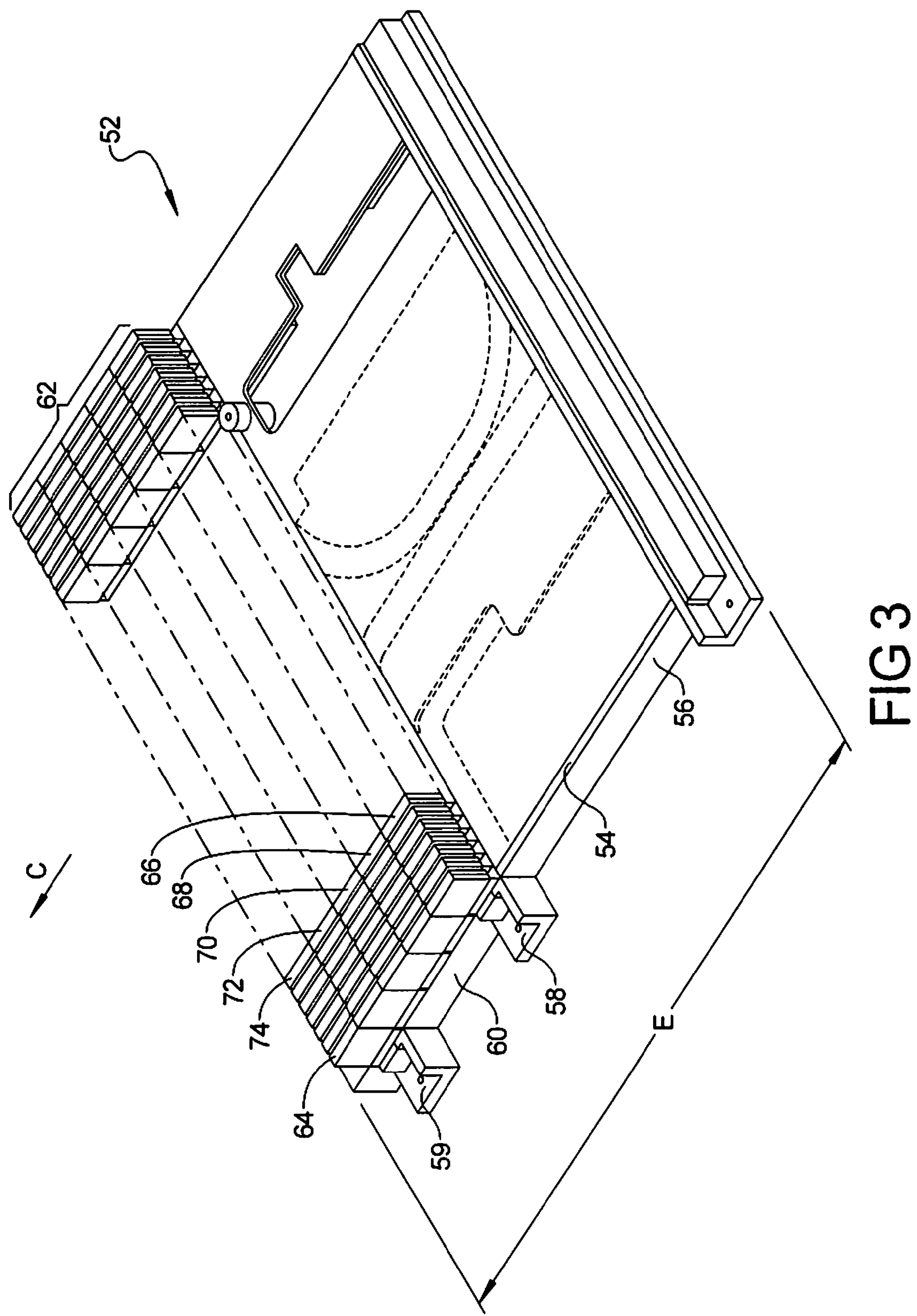
FIG. 3 is a top left perspective view of another aspect of a circuit board assembly of the present enclosure.
Figure 4:
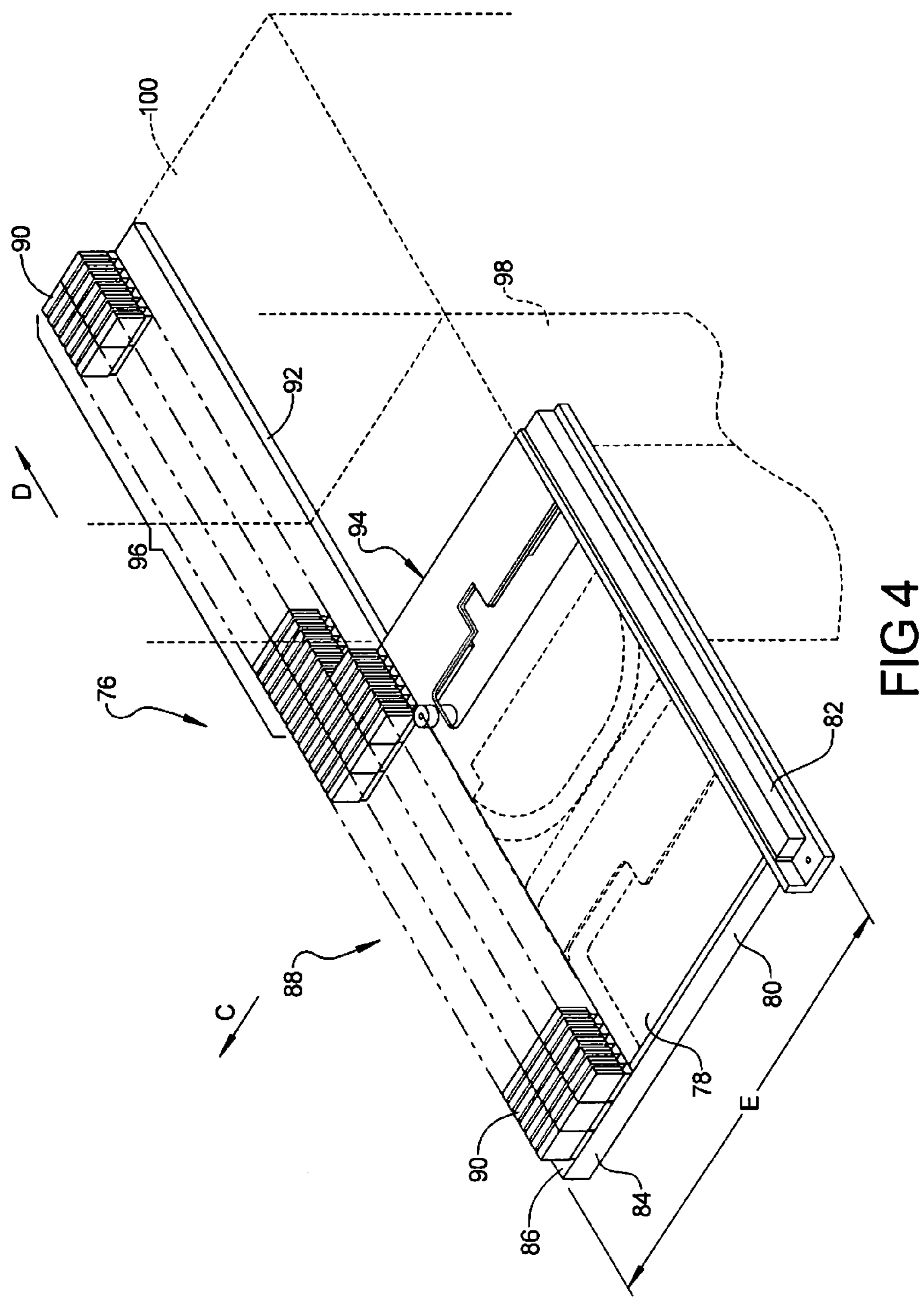
FIG. 4 is a top left perspective view of a further aspect of a circuit board assembly of the present enclosure.

Referring to FIG. 4 and again to FIGS. 1-3, according to further aspects a circuit board assembly 76 is further modified to provide heat transfer components extending not only in the lateral direction "C", but further in a longitudinal direction "D" with respect to a PCB 78. PCB 78 is mounted to a first mounting frame portion 80 having a first false board edge 82 on a first edge thereof. A second mounting frame portion 84 is connected to mounting frame portion 80 and extends in the lateral direction "C" with respect to first mounting frame portion 80. Second mounting frame portion 84 includes a second false board edge 86 oppositely directed with respect to first false board edge 82.

An assembly 88 of heat transfer components 90 includes multiple rows of heat transfer components 90 configured in exemplary first, second and third rows extending in the lateral direction "C". Additional heat transfer components 90 are provided on a third mounting frame portion 92 which is directly connected to and extends in a longitudinal direction "D" with respect to second mounting frame portion 84 and is oriented coplanar to both first and second mounting frame portions 80, 84. A longitudinal second assembly 96 having multiple heat transfer components 90 is arranged on the third mounting frame portion 92. Heat transfer components 90 provided on third mounting frame portion 92 are thereby longitudinally extended with respect to PCB 78 in the longitudinal direction "D" away from PCB 78. Heat generated by PCB 78 can therefore be conductively and convectively transferred past a backplane 98 (only partially shown for clarity) to a lower temperature component area 100 of the cabinet 12, where for example additional air flow may be available for convection cooling.

Circuit board assemblies and false board edges of the present disclosure allow for extending the size, and heat dissipating power of a heatsink and heat/mounting frame, while keeping the PCB within standard specified geometries. For example, for an air cooled 3U OVPX board, in a forced convection design (fan cooled), a standards based 3U air cooled heat/mounting frame could be employed. When for example the same design PCB was needed in a 6U natural convection system, the heat/mounting frame can be extended as noted herein to match the 6U OVPX footprint, which provides for the necessary cooling, while keeping the PCB unchanged. Beyond cooling or the reuse of boards in adjacent mechanical footprints, the additional space provided by the extended heat/mounting frame of the present disclosure can address mechanical concerns as well. For example, a large PCB can have issues under severe shock and vibration loads. One or more of the presently disclosed mounting frame portions/extensions could extend away from the PCB to provide additional stiffness, such as having a third set of wedge-locks in the center of the heat/mounting frame. Alternately, a single larger heat/mounting frame can be used to mechanically tie several smaller PCBs together into a single integrated unit.

According to several embodiments, the circuit board assembly 10, 52, 76 includes a first mounting frame portion 22, 56, 80 of a first standards based size (for example having a 3U OVPX size/space envelope) having PCB 20, 54, 78 mounted thereto. The first standards based size therefore provides the capability of the circuit board assembly 10, 52, 76 to slidably fit within the first and second slots of a cabinet designed to receive circuit board assemblies of the first standards based size. The second mounting frame portion 32, 60, 84 is connected to the first mounting frame portion 22, 56, 80 having no portion of the PCB 20, 54, 78 connected thereto, such that the size of PCB 20, 54, 78 does not change when incorporated on the circuit board assembly 10, 52, 76. A combination size (defined as having a spacing or distance "E" between the first and second false board edges such as first and second false board edges 26, 36) of the first and second mounting frame portions 22, 56, 80 and 32, 60, 84 defines a larger second size (for example having a 6U OVPX size/space envelope). The second size therefore provides the capability for the circuit board assembly 10, 52, 76 to slidably fit within the first and second slots 14, 16 of cabinet 12. At least one heat transfer component 38, 74, 90 is connected to the second mounting frame portion 32, 60, 84 creating the conduction/convection cooling path "B" away from the first mounting frame portion 22, 56, 80 for removing heat generated by the PCB 20, 54, 78 via the second mounting frame portion 32, 60, 84.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A circuit board assembly, comprising:

a first mounting frame portion of a first size having a PCB mounted thereto;

a second mounting frame portion connected to the first mounting frame portion having no portion of the PCB connected thereto, a combination size of the first and second mounting frames defining a larger second size;

a third mounting frame portion connected to the second mounting frame portion and having no portion of the PCB connected thereto, the third mounting frame portion extending longitudinally from the second mounting frame portion; and at least one heat transfer component connected to the first or second mounting frame portion creating a conduction/convection cooling path;

wherein the first mounting frame portion includes a first false board edge, and the second mounting frame portion includes at least one false board edge positioned laterally and opposite with respect to the first false board edge.

2. The circuit board assembly of claim 1, wherein the first size equates to a 3U OVPX panel.

3. The circuit board assembly of claim 2, wherein the second size equates to a 6U OVPX panel.

4. The circuit board assembly of claim 1, further including a plurality of heat transfer components connected to the third mounting frame portion.

5. The circuit board assembly of claim 1, wherein the at least one heat transfer component comprises multiple cooling fins.

6. The circuit board assembly of claim 1, further including first and second support wings connected to the second mounting frame portion.

7. The circuit board assembly of claim 1, wherein the second mounting frame portion is an integral extension of the first mounting frame portion.

8. A circuit board assembly for installation in a cabinet, comprising:

a first mounting frame portion of a first size having a PCB mounted thereto;

a second mounting frame portion connected to the first mounting frame portion having no portion of the PCB connected thereto, a combination size of the first and second mounting frames defining a larger second size, wherein the second mounting frame portion is positioned above the PCB when the circuit board assembly is mounted in the cabinet thereby providing a conductive heat transfer path to a cabinet first wall;

multiple heat transfer components connected to the second mounting frame portion providing a conduction/convection cooling path away from the first mounting frame portion for removing heat generated by the PCB via the second mounting frame portion; and the first mounting frame portion that includes a first false board edge, and the second mounting frame portion that includes one or more false board edges positioned laterally and oppositely directed with respect to the first false board edge, the first and second false board edges being slidably received in opposed slots created in a cabinet.

9. The circuit board assembly of claim 8, wherein the heat transfer components are configured in an assembly having multiple rows of the heat transfer components.

10. The circuit board assembly of claim 9, wherein the assembly includes the heat transfer components configured in at least first, second, third, fourth and fifth rows extending in a lateral direction with respect to the PCB.

11. The circuit board assembly of claim 8, further including a heat frame in contact with the PCB wherein heat generated by electrical components of the PCB is conductively transferred away from the PCB via the heat frame in addition to the second mounting frame portion.

12. An electronic cabinet system, comprising:

a cabinet having a first board slot created in a cabinet first wall and a second board slot created in a cabinet second wall;

a circuit board assembly, including:

a first mounting frame portion of a first standards based circuit board size having a PCB mounted thereto;

a second mounting frame portion connected to the first mounting frame portion having no portion of the PCB connected thereto, a combination size of the first and second mounting frames defining a larger second circuit board size;

a third mounting frame portion connected to the second mounting frame portion and extending in a lateral direction with respect to the PCB;

at least one heat transfer component connected to the second mounting frame portion providing a conduction/convection cooling path away from the first mounting frame portion for removing heat generated by the PCB via the second mounting frame portion; and the first mounting frame portion including a first false board edge slidably received in the first board slot and the second mounting frame portion including a second false board edge positioned laterally and oppositely directed with respect to the first false board edge, the second false board edge slidably received in the second board slot.

13. The electronic cabinet system of claim 12, wherein the second mounting frame portion is positioned above the first mounting frame portion when the circuit board assembly is mounted in the cabinet to provide for heat transfer into the second mounting frame portion.

14. The electronic cabinet system of claim 12, wherein an assembly of the heat transfer components includes multiple rows of heat transfer components configured in at least first, second, third, fourth and fifth rows.

15. The electronic cabinet system of claim 12, wherein an assembly of the heat transfer components includes multiple rows of heat transfer components configured in at least first, second and third rows.

16. The electronic cabinet system of claim 12, wherein the third mounting frame portion is positioned in a different cabinet area than the first and second mounting frame portions.

* * * * *